(12) United States Patent
Lung

(10) Patent No.: US 7,220,983 B2
(45) Date of Patent: May 22, 2007

(54) SELF-ALIGNED SMALL CONTACT PHASE-CHANGE MEMORY METHOD AND DEVICE

(75) Inventor: Hsiang Lan Lung, Elmsford, NY (US)

(73) Assignee: Macronix International Co., Ltd., Hsinchu (TW)

( * ) Notice: Subject to any disclaimer, the term of this patent is extended or adjusted under 35 U.S.C. 154(b) by 69 days.

(21) Appl. No.: 11/009,365

(22) Filed: Dec. 9, 2004

(65) Prior Publication Data
US 2006/0124916 A1 Jun. 15, 2006

(51) Int. Cl.
*H01L 47/00* (2006.01)
(52) U.S. Cl. ............... 257/4; 257/3; 438/95
(58) Field of Classification Search .......... 257/2–5; 438/95, 267, 304; 365/148, 163
See application file for complete search history.

(56) References Cited

U.S. PATENT DOCUMENTS

| | | |
|---|---|---|
| 3,271,591 A | 9/1966 | Ovshinsky |
| 3,530,441 A | 9/1970 | Ovshinsky |
| 4,599,705 A | 7/1986 | Holmberg |
| 4,719,594 A | 1/1988 | Young et al. |
| 4,876,220 A | 10/1989 | Mohsen et al. |
| 5,166,096 A | 11/1992 | Cote et al. |
| 5,166,758 A | 11/1992 | Ovshinsky et al. |
| 5,177,563 A | 1/1993 | Everett et al. |
| 5,177,567 A | 1/1993 | Klersy et al. |
| 5,534,712 A | 7/1996 | Ovshinsky et al. |
| 5,687,112 A | 11/1997 | Ovshinsky |
| 5,789,227 A | 8/1998 | Dees |
| 5,789,277 A | 8/1998 | Zahorik et al. |
| 5,789,758 A | 8/1998 | Reinberg |
| 5,814,527 A | 9/1998 | Wolstenholme et al. |
| 5,831,276 A | 11/1998 | Gonzalez et al. |
| 5,837,564 A | 11/1998 | Sandhu et al. |
| 5,869,843 A | 2/1999 | Harshfield |
| 5,879,955 A | 3/1999 | Gonzalez et al. |
| 5,920,788 A | 7/1999 | Reinberg |
| 5,952,671 A | 9/1999 | Reinberg et al. |
| 5,970,336 A | 10/1999 | Wolstenholme et al. |
| 5,985,698 A | 11/1999 | Gonzalez et al. |

(Continued)

FOREIGN PATENT DOCUMENTS

WO       WO 00/45108 A1       8/2000

(Continued)

OTHER PUBLICATIONS

Adler, David, "Amorphous-Semiconductor Devices," Sci. Amer., vol. 236, pp. 36-48, May 1977.

(Continued)

*Primary Examiner*—Sara Crane
(74) *Attorney, Agent, or Firm*—Ernest J. Beffel, Jr.; Haynes Beffel & Wolfeld

(57) ABSTRACT

The invention relates to a novel memory cell structure and process to fabricate chalcogenide phase change memory. More particularly, it produces a small cross-sectional area of a chalcogenide-electrode contact part of the phase change memory, which affects the current/power requirement of the chalcogenide memory. Particular aspects of the present invention are described in the claims, specification and drawings.

16 Claims, 7 Drawing Sheets

U.S. PATENT DOCUMENTS

| | | | |
|---|---|---|---|
| 5,998,244 | A | 12/1999 | Wolstenholme et al. |
| 6,011,725 | A | 1/2000 | Eitan |
| 6,025,220 | A | 2/2000 | Sandhu |
| 6,031,287 | A | 2/2000 | Harshfield |
| 6,034,882 | A | 3/2000 | Johnson et al. |
| 6,077,729 | A | 6/2000 | Harshfield |
| 6,087,674 | A | 7/2000 | Ovshinsky et al. |
| 6,104,038 | A | 8/2000 | Gonzalez et al. |
| 6,111,264 | A | 8/2000 | Wolstenholme et al. |
| 6,111,720 | A | 8/2000 | Clare et al. |
| 6,114,713 | A | 9/2000 | Zahorik |
| 6,117,720 | A | 9/2000 | Harshfield |
| 6,131,287 | A | 10/2000 | Prochaska et al. |
| 6,147,395 | A | 11/2000 | Gilgen |
| 6,150,253 | A | 11/2000 | Doan et al. |
| 6,153,890 | A | 11/2000 | Wolstenholme et al. |
| 6,177,317 | B1 | 1/2001 | Huang et al. |
| 6,185,122 | B1 | 2/2001 | Johnson et al. |
| 6,189,582 | B1 | 2/2001 | Reinberg et al. |
| 6,236,059 | B1 | 5/2001 | Wolstenholme et al. |
| RE37,259 | E | 7/2001 | Ovshinsky |
| 6,271,090 | B1 | 8/2001 | Huang et al. |
| 6,280,684 | B1 | 8/2001 | Yamada et al. |
| 6,287,887 | B1 | 9/2001 | Gilgen |
| 6,314,014 | B1 | 11/2001 | Lowrey et al. |
| 6,320,786 | B1 | 11/2001 | Chang et al. |
| 6,339,544 | B1 | 1/2002 | Chiang et al. |
| 6,351,046 | B1 | 2/2002 | Bradfield |
| 6,420,215 | B1 | 7/2002 | Knall et al. |
| 6,420,216 | B1 | 7/2002 | Clevenger et al. |
| 6,420,725 | B1 | 7/2002 | Harshfield |
| 6,423,621 | B2 | 7/2002 | Doan et al. |
| 6,429,064 | B1 | 8/2002 | Wicker |
| 6,462,353 | B1 | 10/2002 | Gilgen |
| 6,483,736 | B2 | 11/2002 | Johnson et al. |
| 6,487,114 | B2 | 11/2002 | Jong et al. |
| 6,501,111 | B1 | 12/2002 | Lowrey |
| 6,511,867 | B2 | 1/2003 | Lowrey et al. |
| 6,512,241 | B1 | 1/2003 | Lai |
| 6,514,788 | B2 | 2/2003 | Quinn |
| 6,534,781 | B2 | 3/2003 | Dennison |
| 6,545,903 | B1 | 4/2003 | Wu |
| 6,549,760 | B1 | 4/2003 | Honma et al. |
| 6,555,860 | B2 | 4/2003 | Lowrey et al. |
| 6,563,156 | B2 | 5/2003 | Harshfield |
| 6,566,700 | B2 | 5/2003 | Xu |
| 6,567,293 | B1 | 5/2003 | Lowrey et al. |
| 6,579,760 | B1 | 6/2003 | Lung |
| 6,586,761 | B2 | 7/2003 | Lowrey |
| 6,589,714 | B2 | 7/2003 | Maimon et al. |
| 6,593,176 | B2 | 7/2003 | Dennison |
| 6,597,009 | B2 | 7/2003 | Wicker |
| 6,605,527 | B2 | 8/2003 | Dennison et al. |
| 6,605,821 | B1 | 8/2003 | Lee et al. |
| 6,607,974 | B2 | 8/2003 | Harshfield |
| 6,613,604 | B2 | 9/2003 | Maimon et al. |
| 6,617,192 | B1 | 9/2003 | Lowrey et al. |
| 6,621,095 | B2 | 9/2003 | Chiang et al. |
| 6,639,849 | B2 | 10/2003 | Takahashi et al. |
| 6,673,700 | B2 | 1/2004 | Dennison et al. |
| 6,744,088 | B1 | 6/2004 | Dennison |
| 6,791,102 | B2 | 9/2004 | Johnson et al. |
| 6,797,979 | B2 | 9/2004 | Chiang et al. |
| 6,805,563 | B2 | 10/2004 | Xu |
| 6,815,704 | B1 | 11/2004 | Chen |
| 6,861,267 | B2 | 3/2005 | Xu et al. |
| 6,864,500 | B2 | 3/2005 | Gilton |
| 6,864,503 | B2 | 3/2005 | Lung |
| 6,867,638 | B2 | 3/2005 | Saiki et al. |
| 6,894,305 | B2 | 5/2005 | Yi et al. |
| 6,909,107 | B2 | 6/2005 | Rodgers et al. |
| 6,927,410 | B2 | 8/2005 | Chen |
| 6,933,516 | B2 | 8/2005 | Xu |
| 6,936,840 | B2 | 8/2005 | Sun et al. |
| 6,937,507 | B2 | 8/2005 | Chen |
| 6,992,932 | B2 | 1/2006 | Cohen |
| 7,023,009 | B2 * | 4/2006 | Kostylev et al. ............... 257/4 |
| 2001/0055838 | A1 | 12/2001 | Walker et al. |
| 2002/0081833 | A1 | 6/2002 | Li et al. |
| 2004/0248339 | A1 | 12/2004 | Lung |
| 2005/0215009 | A1 | 9/2005 | Cho |

FOREIGN PATENT DOCUMENTS

| | | |
|---|---|---|
| WO | WO 00/79539 A1 | 12/2000 |
| WO | WO 01/45108 A1 | 6/2001 |

OTHER PUBLICATIONS

Adler, D. et al., "Threshold Switching in Chalcogenide-Glass Thin Films," J. Appl/ Phys 51(6), Jun. 1980, pp. 3289-3309.

Axon Technologies Corporation paper: Technology Description, pp. 1-6.

Blake thesis, "Investigation of GeTeSb5 Chalcogenide Films for Use as an Analog Memory," AFIT/GE/ENG/00M-04, Mar. 2000, 121 pages.

Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4 pp.

Kojima, Rie et al., "Ge-Sn-Sb-Te Phase-change Recording Material Having High Crystallization Speed," Proceedings of PCOS 2000, 36-41.

Lankhorst, Martijn H. R., et al; Low-Cost and Nanoscale Non-Volatile Memory Concept for Future Silicon Chips, Mar. 13, 2005, 6 pp., Nature Materials Advance Online Publication, www.nature.com/naturematerials.

Lai, Stephan et al., OUM-A 180 nm Nonvolatile Memory Cell Element Technology for Stand Alone and Embedded Applications, IEEE IEDM 2001, pp. 803-806.

Mott, Nevill, "Electrons in Glass," Nobel Lecture, Dec. 8, 1977, Physics, 1977, pp. 403-413.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Prakash, S. et al., "A Guideline for Designing Chalcogenide-Based Glasses for Threshold Switching Characteristics," IEEE Electron Device Letters, vol. 18, No. 2, Feb. 1997, pp. 45-47.

Rochefort, C. et al., "Manufacturing of High Aspect-Ration p-n Junctions Using Vapor Phase Doping for Application in Multi-Resurf Devices," IEEE 2002.

Strauss, Karl F. et al., "Overview of Radiation Tolerant Unlimited Write Cycle Non-Volatile Memory," IEEE 2000.

Subramanian, Vivek et al., "Low Leakage Germanium-Seeded Laterally-Crystallized Single-Grain 100-nm TFT's for Vertical Integration Applications," IEEE Electron Device Letters, vol. 20, No. 7, Jul. 1999.

Wicker, Guy et al., Nonvolatile, High Density, High Performance Phase Change Memory, 1999, http://klabs.org/richcontent/MAPLDCon99/Papers/P21 Tyson P.PDF#search='nonvolatile%20high%20density%20high%20performance%20phase%20change%20memory', 8 pages.

Wicker, Guy, "A Comprehensive Model of Submicron Chalcogenide Switching Devices," Doctoral Dissertation, Wayne State University, Detroit, MI, 1996.

Wolf, Stanley, Excerpt from: Silicon Processing for the VLSI Era-vol. 4, pp. 674-679, 2004.

Yi, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

Gill, Manzur et al., "A High-Performance Nonvolatile Memory Technology for Stand-Alone Memory and Embedded Applications," 2002 IEEE-ISSCC Technical Digest (TD 12.4), 7 pp.

Ahn, S.J. et al., "A Highly Manufacturable High Density Phase Change Memory of 64 Mb and Beyond," IEEE IEDM 2004, pp. 907-910.

Bedeschi, F. et al., "4-MB MOSFET-Selected Phase-Change Memory Experimental Chip," IEEE, 2004, 4 pp.

Ha, Y. H. et al., "An Edge Contact Type Cell fro Phase Change RAM Featuring Very Low Power Consumption," 2003 Symposium on VLSI Technology Digest of Technical Papers, pp. 175-176.

Horii, H. et al., "A Novel Cell Technology Using N-doped GeSbTe Films for Phase Change RAM," 2003 Symposium on VLSI Technology Digest of Technical Papers, pp. 177-178.

Hudgens, S. et al., "Overview of Phase-Change Chalcogenide Nonvolatile Memory Technology," MRS Bulletin, Nov. 2004, pp. 829-832.

Hwang, Y. N. et al., "Full Integration and Reliability Evaluation of Phase-change RAM Based on 0.24μm-CMOS Technologies," 2003 Symposium on VLSI Technology Digest of Technical Papers, pp. 173-174.

Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA, 2004, pp. 28-29 and workshop cover sheet.

Kojima, Rie et al., "Ge-Sn-Sb-Te Phase-change Recording Material Having High Crystallization Speed," Proceedings of PCOS 2000, pp. 36-41.

Lacita, A. L.; "Electrothermal and Phase-change Dynamics in Chalcogenide-based Memories," IEEE IEDM 2004, 4 pp.

Lai, Stefan, "Current Status of the Phase Change Memory and Its Future," IEEE IEDM 2003, pp. 255-258.

"New Memories Tap Spin, Gird for Battle," Science News, Apr. 3, 1999, p. 223, vol. 155.

Pellizer, F. et al., "Novel μTrench Phase-Change Memory Cell for Embedded and Stand-Alone Non-Volatile Memory Applications," 2004 Symposium on VLSI Technology Digest of Technical Papers, pp. 18-19.

Pirovano, Agostino et al., "Reliability Study of Phase-Change Nonvolatile Memories," IEEE Transactions on Device and Materials Reliability, Sep. 2004, pp. 422-427, vol. 4, No. 3.

Radaelli, A. et al., "Electronic Switching Effect and Phase-Change Transition in Chalcogenide Materials," IEEE Electron Device Letters, Oct. 2004, pp. 684-686, vol. 25, No. 10.

* cited by examiner

SELF-ALIGNED SMALL CONTACT PHASE-CHANGE MEMORY METHOD AND DEVICE

RELATED APPLICATIONS

This application is related to a pair of commonly owned applications by the same inventor. It is related to U.S. application Ser. No. 10/215,956, filed on 9 Aug. 2002, entitled "Spacer Chalcogenide Memory and Device", now U.S. Pat. No. 6,864,503; and to U.S. application Ser. No. 10/108,658, filed on 28 Mar. 2002, entitled "Self-Aligned, Programmable Phase Change Memory", now U.S. Pat. No. 6,579,760. These related applications are hereby incorporated by reference, as if set forth in full.

BACKGROUND OF THE INVENTION

1. Field of Invention

The invention relates to a novel memory cell structure and process to fabricate chalcogenide phase change memory. More particularly, it produces a small cross-sectional area of a chalcogenide-electrode contact part of the phase change memory, which affects the current/power requirement of the chalcogenide memory.

2. Background

Chalcogenides have been utilized in the formation of memory cells for integrated circuit memory devices. Representative prior art patents in this field include Reinberg, U.S. Pat. No. 5,789,758; Harshfield, U.S. Pat. No. 6,077,729; Wolstenholme, et al., U.S. Pat. No. 6,153,890, Ovshinsky, U.S. Reissue Pat. No. RE37,259 (Reissue of U.S. Pat. No. 5,687,112), and many others.

Chalcogenides used for integrated circuit memory devices are materials characterized by more than one solid-state phase, and which can be switched between such phases using the application of heat caused for example by electrical current or optical pulses. Memory cells which include a chalcogenide element are arranged in an array which can be addressed using conventional word lines/bit line addressing schemes common in integrated circuit memories. The state of the memory cell is determined by the bulk resistance of the chalcogenide element. Because the different solid-state phases of the chalcogenide have different resistivity, the bulk resistance of the chalcogenide element indicates the amount of the chalcogenide element in a selected phase state.

The problem of applying current at sufficient current densities to cause the phase change in the chalcogenide element is reflected in the design of the memory cells. Typically, relatively complex structures are utilized to form small pores in the current path that is coupled to the chalcogenide element. Current is concentrated through the small pores to induce a locally high current density in the chalcogenide element.

The complex structures utilized to form the pores, and other aspects of chalcogenide based memory cells, have required relatively large cell sizes to implement. Furthermore, complex structures can affect the reliability of the memory devices. Large cell sizes limit the density of the memory device, and increase its cost. Likewise, reliability in manufacturing is critical to successful commercial application of memory devices. High-density, self aligned memory cells have been manufactured for other types of storage technologies, such as the vertically stacked, non-volatile memory described in Johnson et al., U.S. Pat. No. 6,185,122.

One approach to producing higher density cells is proposed by Wicker, U.S. Pat. No. 6,597,009, entitled "Reduced Contact Area of Sidewall Conductor". In Wicker's design, a trench 250 is the size of or narrower than a phase change material plug 290. The phase change material plug is aligned over one of two sidewall conductors 260 that are electrically coupled. Plugs of phase change material 290 are discontinuous and separated by an insulator.

Accordingly, it is desirable to provide phase change memory cell structures and devices with smaller sizes and power requirements. Furthermore, it is desirable to provide methods for manufacturing such devices, which are efficient and result in reliable structures.

SUMMARY OF THE INVENTION

The invention relates to a novel memory cell structure and process to fabricate chalcogenide phase change memory. More particularly, it produces a small cross-sectional area of a chalcogenide-electrode contact part of the phase change memory, which affects the current/power requirement of the chalcogenide memory. Particular aspects of the present invention are described in the claims, specification and drawings.

BRIEF DESCRIPTION OF THE DRAWINGS

The general structure of devices that utilize phase change materials in memory devices is depicted by FIG. 1.

Figure 3:
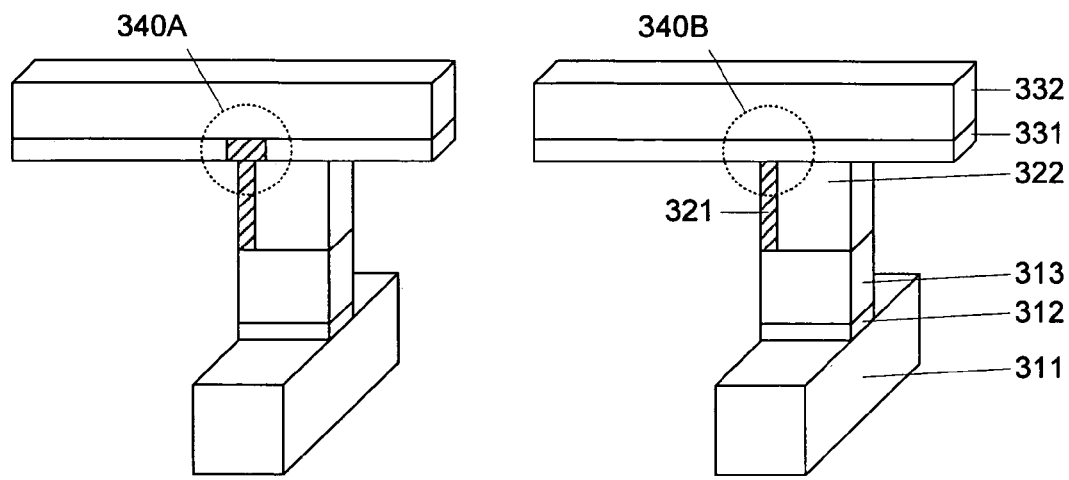

The operation of a phase change memory practicing aspects of the present invention is illustrated by FIG. 3.

Figure 4:
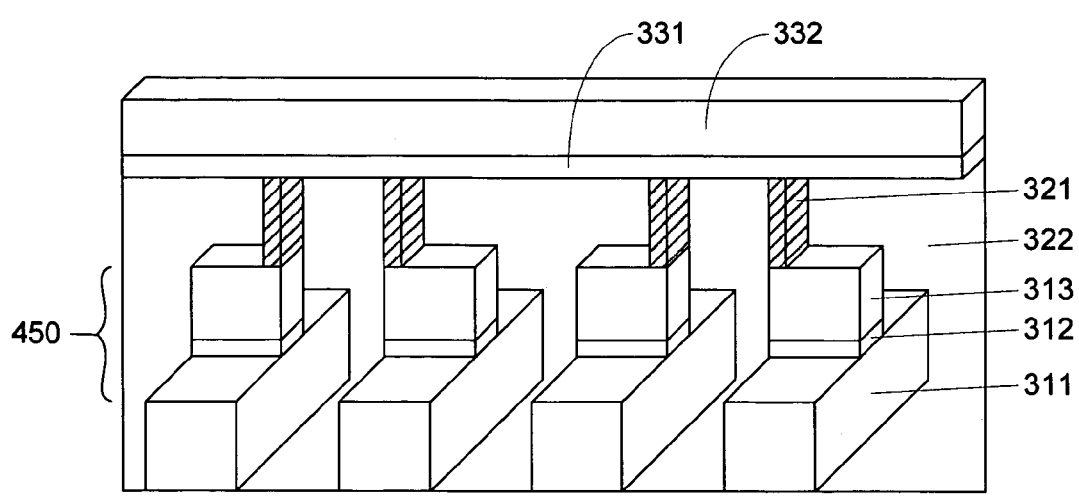
Figure 5:
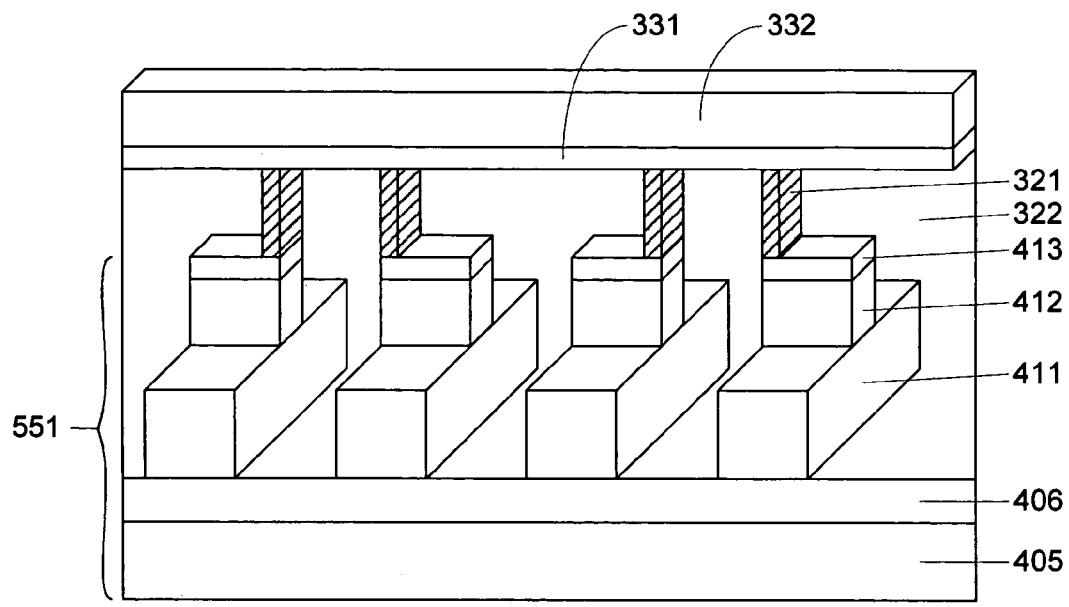

Two alternative embodiments of structures generally illustrated by FIG. 3 are found in FIGS. 4 and 5.

FIGS. 6 through 13 illustrate a process for building structures such as those depicted in FIGS. 3–5.

DETAILED DESCRIPTION

The following detailed description is made with reference to the figures. Preferred embodiments are described to illustrate the present invention, not to limit its scope, which is defined by the claims. Those of ordinary skill in the art will recognize a variety of equivalent variations on the description that follows.

The present invention provides a self-aligned, nonvolatile memory structure based upon phase change materials, including chalcogenides, and methods for manufacturing integrated circuit devices using the structure. The memory structure can be made within a very small area on an integrated circuit. For a preferred implementation, the area required for each memory cell in an array is about 4F2, where F is equal to the minimum line width for the manufacturing process. Thus, for processes having a minimum line width of 0.1 microns, the memory cell area is about 0.04 microns squared.

Furthermore, the manufacturing process results in self-aligned memory cells requiring a reduced number of array-related masks defining the bit lines and word lines. Memory cells are defined at intersections of bit lines and word lines, and have dimensions that are defined by the widths of the bit lines and word lines in a self-aligned process.

The use of phase change materials including chalcogenides, in the structure of the present invention provides for high-density non-volatile and programmable memory devices.

A chalcogenide alloy contains one or more elements from column six of the periodic table of elements. Many chalcogenide phase-change alloys have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_a Ge_b Sb_{100-(a+b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. Ovshinsky '112 patent, cols 10–11. Particular alloys evaluated by another researcher include $Ge_2Sb_2Te_5$, $GeSb_2Te_4$ and $GeSb_4Te_7$. Noboru Yamada, "Potential of Ge—Sb—Te Phase-Change Optical Disks for High-Data-Rate Recording", *SPIE* v.3109, pp. 28–37 (1997). More generally, a transition metal such as Cr, Fe, Ni, Nb, Pd, Pt and mixtures or alloys thereof may be combined with Ge/Sb/Te to form a phase-change alloy that has programmable resistive properties. Specific examples of memory materials that may be useful are given in Ovshinsky '112 cols. 11–13, which examples are hereby incorporated by reference.

Phase-change alloys are capable being switched between a first structural state in which the material is generally amorphous and a second structural state in which the material is generally crystalline in its local order. These alloys are at least bistable. The term amorphous is used to refer to a relatively less ordered structure, more disordered than a single crystal, which has the detectable characteristics such as high electrical resistivity. The term crystalline is used to refer to a relatively more ordered structure, more ordered than an amorphous structure, which has detectable characteristics such as lower electrical resistivity than the amorphous state. Typically, phase-change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Figure 1:
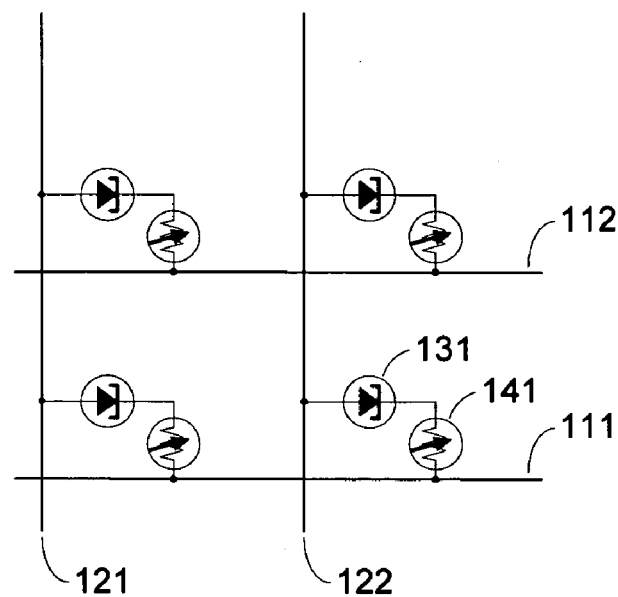

The general structure of devices that utilize phase change materials in memory devices is depicted by FIG. 1. Memory cells are positioned between word lines 111, 112 and bit lines 121, 122. Memory cells typically include a selection device 131 electrically coupled to phase change material 141. The symbol for the phase change material 141 indicates that it has a variable resistance, depending on its phase state.

Phase-change alloys are changed from one phase state to another by application of electrical pulses, which are thought to heat the phase change material. It has been observed that a shorter, higher amplitude pulse tends to change the phase-change material to a generally amorphous state. A longer, lower amplitude pulse tends to change the phase-change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase-change alloy. The physical phase-change process has motivated research into structures that use a small amount of programmable resistive material.

Figure 2:
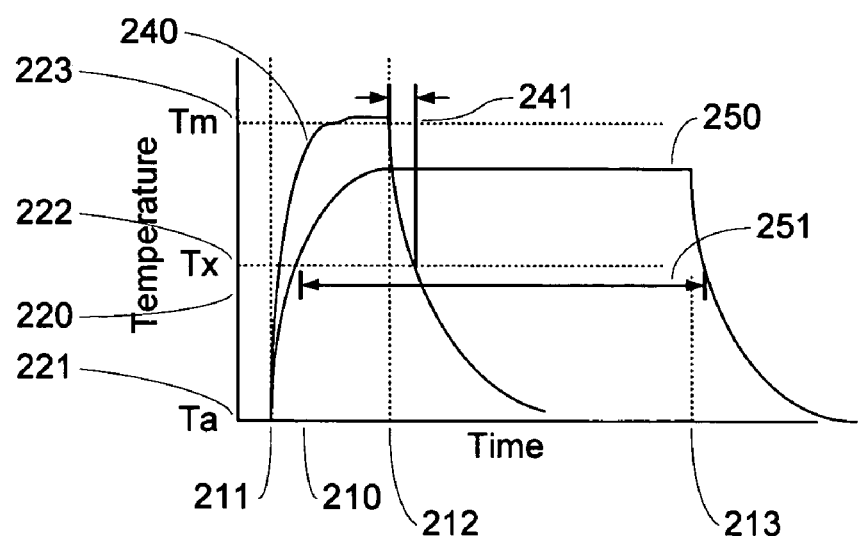
FIG. 2 depicts typical pulse profiles.

FIG. 2 depicts typical pulse profiles. The x-axis 210 corresponds to time. Along the x-axis, the specific times indicated include the beginning of the pulse 211, the turn-off of an amorphizing reset pulse 212 and the turn-off of the crystallizing set pulse 213. The y-axis 220 corresponds to temperature. The temperatures indicated include Ta, which is the ambient temperature 221; Tx, which is the crystallizing threshold 222; and Tm, which is the amorphizing threshold 223. Two curves are depicted, an amorphizing reset pulse curve 240 and a crystallizing set pulse curve 250. The brief duration 241 between the material exceeding the temperature threshold Tm 223 and falling below the temperature threshold Tx 222 results in an amorphous crystalline structure of the phase change material. In contrast, the extended duration 251 at which the phase change material is above the Tx threshold 222 and below the Tm threshold 223 results in a crystalline structure of the phase change material. Of course, some phase change materials have additional phase regions between crystalline and amorphous, for which additional curves could be drawn.

The operation of a phase change memory practicing aspects of the present invention is illustrated by FIG. 3. The structures in FIG. 3 include a bit line 311, a first insulator 312, an additional conductive layer 313, a sidewall spacer electrode 321, a second insulator 322, a phase change material layer 331 and a word line conductive material 332. In the immediate vicinity of the sidewall spacer electrode 321, the structure of the phase change material is affected. In one state, the phase change material 340A has an amorphous state, in which it has a high resistance. In other state, the phase change material 340B has a crystalline structure, in which it has a lesser resistance. The high resistance may be taken as the binary 1 and the lower resistance taken and the binary 0, or vice versa.

Two alternative embodiments of structures generally illustrated by FIG. 3 are found in FIGS. 4 and 5. FIG. 4 illustrates a structure having metal bit and word lines. The bit line 311 may be formed of pure or alloyed aluminum, tungsten, tantalum or platinum. An interface layer between the bit line and the insulator 312 may be used. Insulator 312 may be an aluminum or silicon oxide, such as Al2O3, SiO2, or a comparable material. An additional metal layer 313 may be pure or alloyed Al, Tu, Ta, Pt or similar material. Interface layers may be used above and/or below the second metal layer 313, although they are not illustrated. Collectively, the insulator and additional metal layer 450 act as a tunnel diode in this embodiment. Sidewall spacer electrodes 321 are formed over the second metal layer. Examples of materials suitable for electrodes include TiN, TaN, Ta, TiALN, and TaSiN. Insulator material 322 fills other areas. This insulator material typically is applied in more than one step. The phase change material 331 and metal word line 332 are formed over the sidewall spacer electrodes.

FIG. 5 illustrates an alternative structure having a doped silicon bit line. The illustrated substrate includes a P+ doped layer 405 and a Ptype layer 406. The bit line 411 is formed out of N+ doped silicon. Two additional layers of N type silicon 412 and P+ type silicon 413 are formed over the bit line. Collectively, the substrates, bit line and layers of a doped silicon 405, 406, 411, 412 and 413 act as a bipolar junction transistor (BJT).

Figure 6:
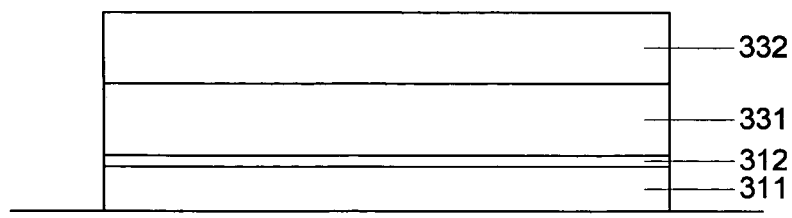

FIGS. 6 through 13 illustrate a process for building structures such as those depicted in FIGS. 3–5. FIG. 6 depicts several layers prior to etching. These layers are numbered as in FIG. 3. At the base is an insulator 303. Over the insulator is a first metal layer 311. Over the first metal layer is a second insulator 312. Over the second insulator is a second metal layer 331. Over the second metal layer is an oxide deposition 332.

Figure 7:
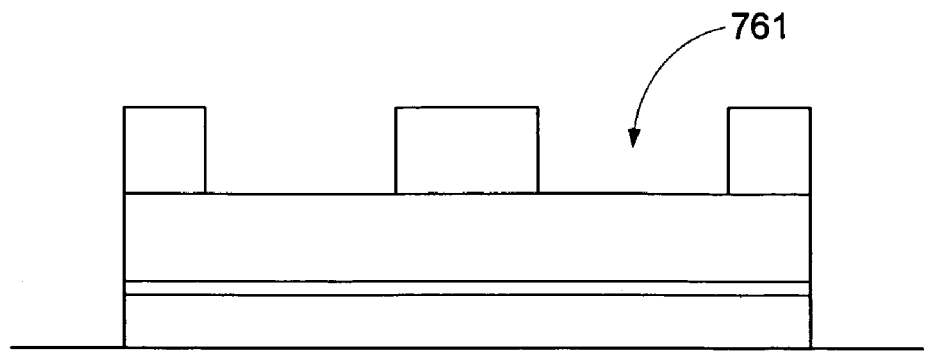

FIG. 7 depicts the stack of FIG. 6 after one or more trenches 761 have been etched in the upper layer. The figure illustrates a plurality of trenches, along which sidewall spacer electrodes will be formed.

Figure 8:
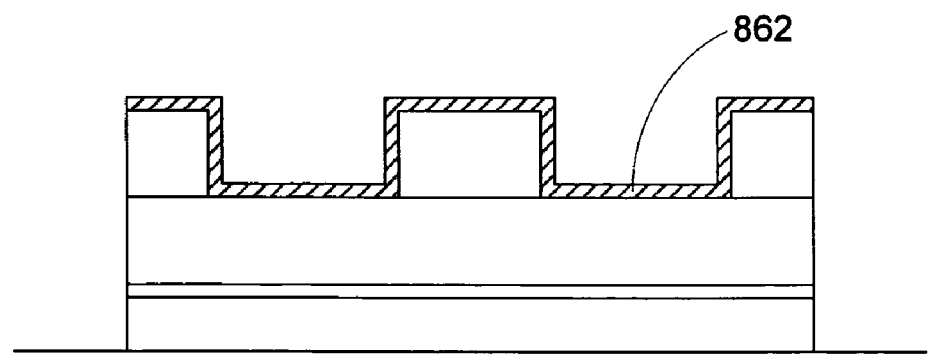

FIG. 8 depicts a stack with trenches of FIG. 7 after an electrode deposition 862. Thickness of about 50A~500A is depicted. Examples of materials suitable for electrodes include TiN, TaN, Ta, TiALN, and TaSiN The resulting deposition layer 862 is thinner than one quarter of the trench 761 width. It typically is thinner than one half of the minimum feature size of the process used to form the trench 761. The thickness of the deposition layer is not limited by lithographic minimum feature size constraints.

Figure 9:
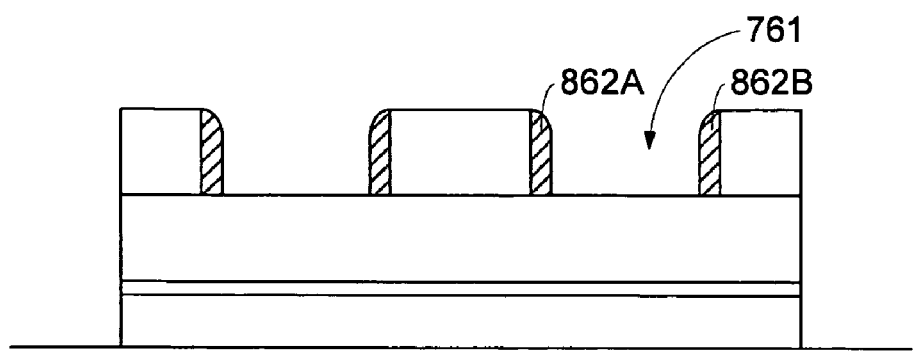

FIG. 9 depicts the electrode deposition layer 862 after etching. A chlorine base RIE anisotropic etching will preferentially remove material at the bottom of a trench, leaving spacers 862A and 862B on opposing sides of the trench 761.

Figure 10:
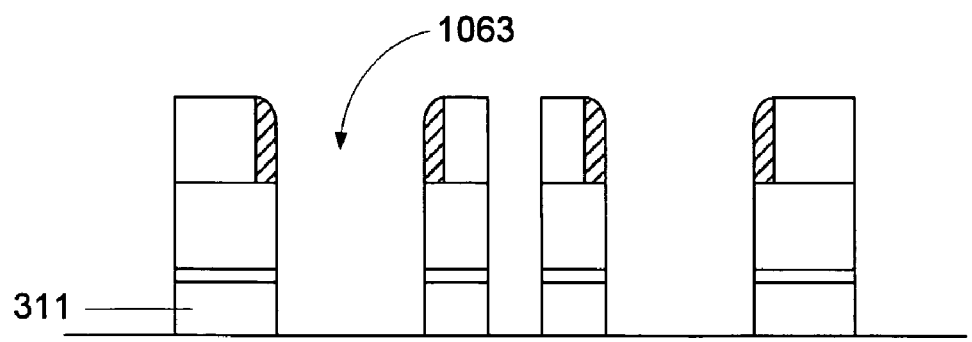

FIG. 10 depicts the stack and spacers after bit line etching, which creates trenches 1063. The trenches 1063 extend through the first and second metal layers to the base insulation 303. Bit lines are defined in the first metal layer 311.

Figure 11:
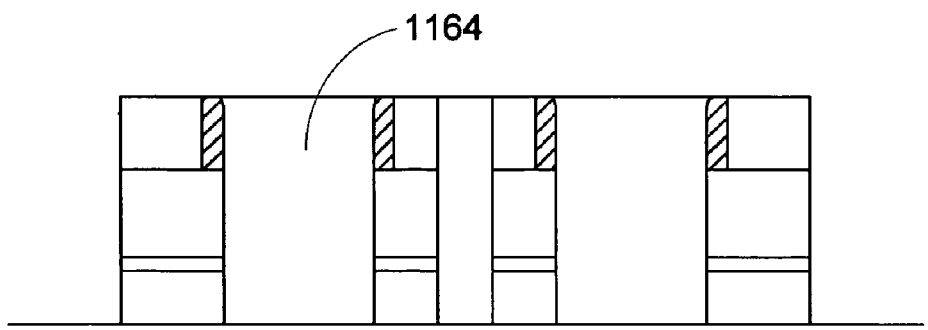

FIG. 11 depicts the formed bit lines after oxide fill-in and chemical mechanical polishing planarization. Oxide or other insulating material fills the trenches 1164. The surface is planarized. As a result, the sidewall spacer electrodes are ready for deposition an additional layer, with which they will be electrically coupled.

Figure 12:
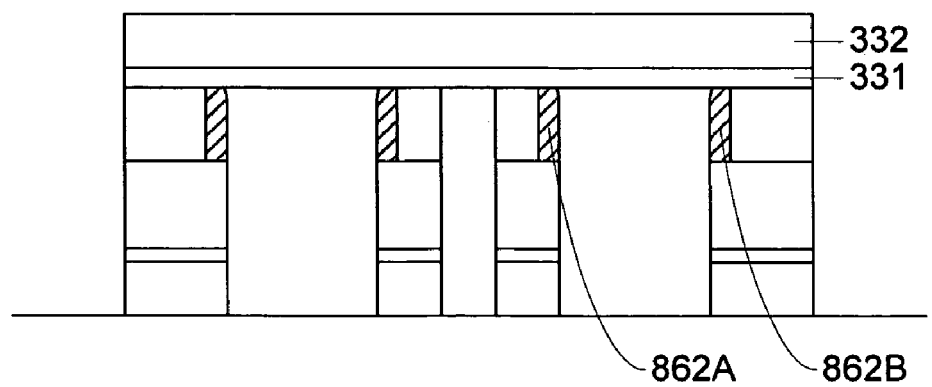

FIG. 12 depicts the structure of FIG. 11 after deposition of phase change layer 331 and a metal layer 332. In this embodiment, the phase change layer is not patterned prior to deposition of the metal layer. An alternative embodiment, the phase change layer could be patterned, leaving the phase change layer 331 discontinuous between the sidewall spacer electrodes, e.g. 862A and 862B. In an alternative embodiment, volumes of phase change material would be electrically isolated from one another.

Figure 13:
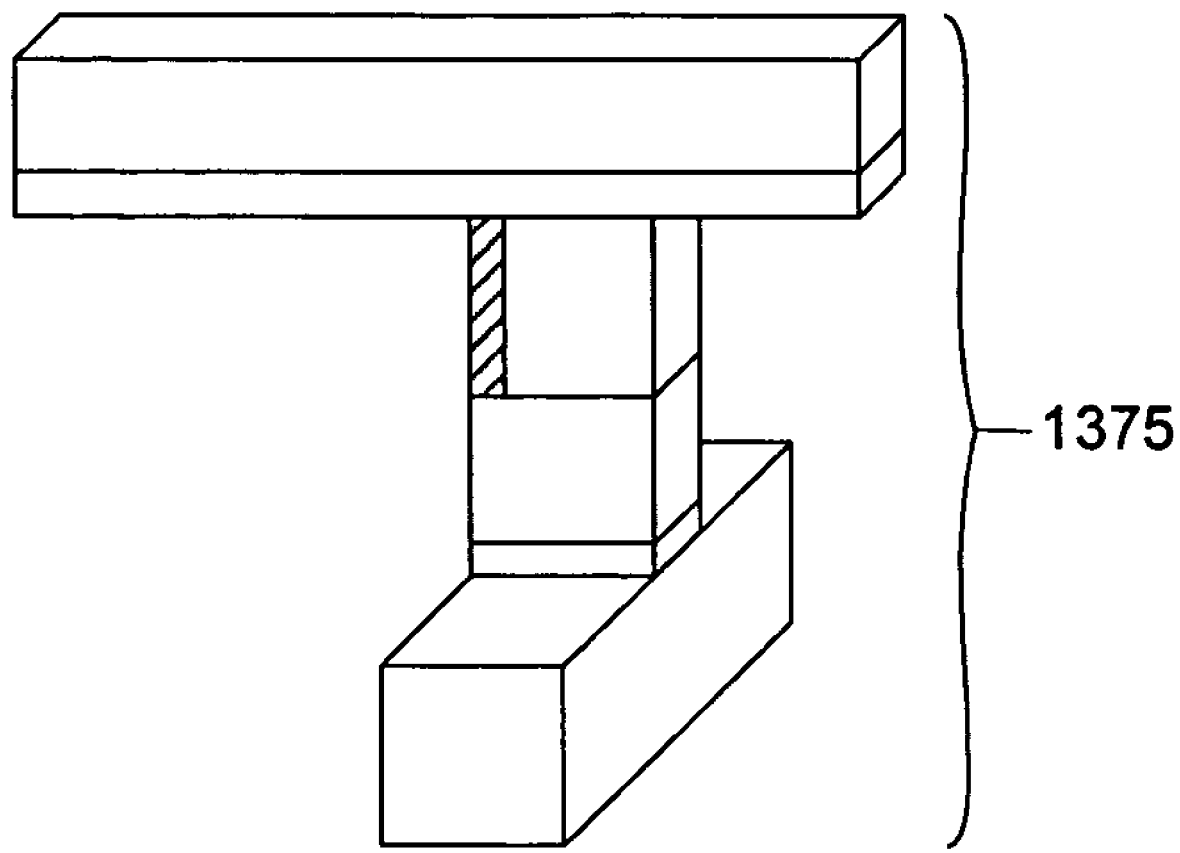

FIG. 13 depicts a single memory cell 1375 after patterning of the phase change and metal layers 331, 332 to form a word line.

While the example in FIGS. 6–13 produces the structure in FIG. 4, the same process can be applied to produce the structure in FIG. 5, with appropriate adjustments for use of doped silicon as a bit line and in layers between the bit line and the sidewall spacer electrode. The similarity between the resulting processes is apparent from comparing FIGS. 4 and 5.

In one embodiment of the present invention, it may be unnecessary to pattern the phase change layer 331 to disrupt its continuity between sidewall spacer electrodes. This reduces the complexity of manufacturing. It also reduces alignment problems. Electrical focus at the top of a particular sidewall spacer electrode is sufficient to change phases and to measure electrical properties of phase change layer, without electrically isolating one segment of phase change material from the next. Adjacent bits on a word line segment are not simultaneously active, so it is not necessary to separately pattern the phase change layer. The phase change layer may span adjacent sidewall spacer electrodes or it may underlie an entire word line segment, servicing the same group of bits as the word line.

The present invention includes methods and devices. One embodiment is a method of manufacturing a memory device, including forming a multi-layer stack in a surface of a substrate, the multi-layer stack including a first conductive layer, a layer or layers of material selected for formation of a selection device and an insulation layer. The method further includes etching trenches through the insulation layer to the layer or layers of material selected for formation of a selection device and forming sidewall spacer electrodes of conductive material along opposing sides of the trenches, over the layer or layers of material selected for formation of a selection device. The method further includes etching gaps into the multi-layer stack to define a first plurality of lines extending in a first direction, wherein the gaps between the first lines extend through the multi-layer stack on the substrate and also separate the sidewall spacers on the opposing sides of the trenches. The method further includes filling gaps with an insulating material and forming a layer or layers of material selected for formation of a phase change memory element over the sidewall spacer electrodes. The method further includes forming a second conductive layer over the layer or layers of phase change material and etching additional gaps into the multi-layer stack and through the layer or layers of phase change material in the second conductive layer, to define a second plurality of lines extending in a second direction so that the first and second pluralities of lines intersect, wherein the additional gaps extend through the multi-layer stack to the first conductive layer, and self-aligned stacks include remaining portions of the layer or layers of material selected for formation of a selection device, the sidewall spacer electrodes, and the layer or layers of material selected for formation of phase change memory element, extending between lines in the first plurality of lines formed by the first conductive layer and lines in the second plurality of lines formed by the second conductive layer.

One aspect in this embodiment is that the substrate may include an insulator at the surface. Alternatively, the substrate may include an integrated circuit device, with an insulator at the surface. In the alternative embodiments, the layer or layers of material selected for formation of a selection device may include a first polysilicon layer with a p-type dopant and a second polysilicon layer with an n-type dopant adapted for formation of a diode. Alternatively, the layer or layers of material selected for formation of a selection device may include a metal layer and an oxide insulator layer adapted for formation of a diode. In any of these embodiments, the layer or layers of material selected for formation of phase change memory may include a layer of chalcogenide. Between the chalcogenide and the sidewall spacer electrodes, the method may involve forming a heating/barrier element. An intermediate heating/barrier layer may be formed having a first resistance. This intermediate layer may be positioned over the sidewall spacer electrodes and be in heat flow communication with the layer or layers of material selected for formation of a phase change memory. The layer or layers of material selected for formation of a phase change memory has a first phase having a lower resistance and a second phase having a higher resistance, the first resistance of the intermediate layer being greater than the higher resistance of the phase change material in the second phase. The intermediate layer also may include a barrier to at least one of diffusion and electromigration of materials on either side of the intermediate layer.

An alternate embodiment of forming a plurality of phase change memory cells includes forming at least two sidewall spacer electrodes, including depositing a conductive material conforming to the sidewalls of a trench and removing a portion the deposited conductive material along a bottom of the trench to define first and second sidewall spacer electrodes along opposing walls of the trench. The method further includes forming a memory phase change material layer over a plurality of the sidewall spacer electrodes. A word line conductive layer is formed over the phase change layer. The word line conductive layer and the memory phase change material layer are patterned to define a word line segment spanning the plurality of sidewall spacer electrodes. This method can be combined with several additional features.

One aspect of the method described above is a thickness of the deposited conductive material. In one embodiment, the thickness ranges from 5 nm to 50 nm. In another embodiment, the thickness is less than one-quarter of a minimum feature size of a process used to form the trench. In another embodiment, a thickness is less than one quarter of the width of the trench.

Another aspect of the method is use of an anisotropic etch to remove material along the bottom of the trench. This etch may be a plasma etch using a chlorine base.

In one embodiment, the memory phase change material layer spans a plurality of sidewall spacer electrodes. Alternatively, the memory phase change material layer is continuous, after patterning, across at least two of the plurality of sidewall spacer electrodes.

In an alternative embodiment, the method includes an additional step of patterning the memory phase change layer before forming the word line conductive layer, so that the memory phase change material layer and the conductive layer are not coincident after patterning. In this an alternative embodiment, the phase change material layer may not be continuous across a plurality of sidewall spacer electrodes.

Another alternative embodiment is a method of forming a plurality of phase change memory cells, including forming a plurality of sidewall spacer electrodes. Forming the sidewall spacer electrodes includes depositing a conductive material conforming to the sidewalls of at least one trench and patterning the deposited conductive material to define sidewall spacer electrodes along at least one wall of at least one trench. The method further includes forming a memory phase change material layer over and spanning at least two of the sidewall spacer electrodes and forming a word line conductive layer over the phase change layer. The method further includes patterning the word line conductive layer and the memory phase change material layer to define a word line segment spanning the at least two sidewall spacer electrodes, wherein the phase change material is continuous across the at least two sidewall spacer electrodes. Aspects of and variations on the prior embodiments may be combined with this alternative embodiment.

Any of the methods described above may be varied with different combinations of conductive and insulating layers. In one embodiment, a bit line conductive layer is formed of N+ doped silicon. The overlying insulating layer may be formed of N type silicon. The additional conductive layer over the insulating layer may be formed of P+ doped silicon. In an alternative embodiment, a bit line conductive layer is formed of metal. The overlying insulator is an oxide. An additional metal layer is formed over the insulating layer.

An embodiment comprises a plurality of phase change memory devices, including at least two bottom electrodes, the two bottom electrodes being sidewall spacers on opposing sides of a trench, and a memory phase change material and conductive word line material structure, patterned as a word line segment spanning a plurality of the bottom electrodes, wherein the phase change material is electrically coupled to the plurality of bottom electrodes and the conductive word line material is electrically coupled to the phase change material. In alternative embodiments, the memory phase change material is continuous across the plurality of bottom electrodes or is not continuous across the plurality of bottom electrodes.

A pair of self-aligned memory devices are within the scope of the present invention. One includes a substrate, a first plurality of conductive layers on the substrate extending in a first direction, and a second plurality of conductive lines above the first plurality of conductive lines and extending in a second direction and crossing over the first plurality of conductive lines at intersections. This device further includes a plurality of memory cells at the intersections and in electrical contact with the first and second pluralities of conductive lines, the memory cells comprising self-aligned structures including a selection device, a sidewall spacer electrode formed as one of a pair of sidewall spacer electrodes on opposing sides of a trench, and a phase change memory element. The other includes a substrate, a first plurality of conductive lines on the substrate extending in a first direction, and a second plurality of conductive lines above the first plurality of conductive lines, extending in a second direction and crossing over the first plurality of conductive lines at intersections. This device further includes a plurality of memory cells at the intersections and in electrical contact with the first and second pluralities conductive lines, the memory cells comprising self-aligned structures including a selection device, a bottom electrode and the phase change memory that is continuous across more than one bottom electrode and more than one memory cell.

Another device embodiment is a plurality of phase change memory devices, including at least two sidewall spacer electrodes, formed along one or more sides of one or more trenches, a memory phase change material continuous over and electrically coupled to the at least two sidewall spacer electrodes, and a conductive word line layer formed over and electrically coupled to the memory phase change layer, patterned as a word line segment spanning the at least two sidewall spacer electrodes.

While the present invention is disclosed by reference to the preferred embodiments and examples detailed above, it is understood that these examples are intended in an illustrative rather than in a limiting sense. It is contemplated that modifications and combinations will readily occur to those skilled in the art, which modifications and combinations will be within the spirit of the invention and the scope of the following claims.

We claim:

1. A method of manufacturing a memory device, including:
    forming a multi-layer stack on a surface of a substrate, the multi-layer stack including a first conductive layer, a layer or layers of material selected for formation of a selection device and an insulation layer;
    etching trenches through the insulation layer to the layer or layers of material selected for formation of a selection device;

forming sidewall spacer electrodes of a conductive material along opposing sides of the trenches, over the layer or layers of material selected for formation of a selection device;

etching gaps into the multi-layer stack to define a first plurality of lines extending in a first direction, wherein the gaps between the first plurality of lines extend through the multi-layer stack on the substrate and separate the sidewall spacers on the opposing sides of the trenches;

filing the gaps with an insulating material;

forming a layer or layers of material selected for formation of a phase change memory element over the sidewall spacer electrodes;

forming a second conductive layer over the layer or layers of phase change material; and etching additional gaps into the multi-layer stack and through the layer or layers of phase change material and the second conductive layer, to define a second plurality of lines extending in a second direction so that the first and second pluralities of lines intersect, wherein the additional gaps extend through the multi-layer stack to the first conductive layer, and self-aligned stacks including remaining portions of the layer or layers of material selected for formation of a selection device, the sidewall spacer electrodes, and the layer or layers of material selected for formation of a phase change memory element, extending between lines in the first plurality of lines formed by the first conductive layer and lines in the second plurality of lines formed by the second conductive layer.

2. The method of claim 1, wherein the substrate includes an insulator at the surface.

3. The method of claim 1, wherein the substrate includes an integrated circuit device, with an insulator at the surface.

4. The method of claim 1, wherein the layer or layers of material selected for formation of a selection device, include a first polysilicon layer with p-type dopant and a second polysilicon layer with n-type dopant adapted for formation of a diode.

5. The method of claim 1, wherein the layer or layers of material selected for formation of a selection device, include a metal layer and an oxide insulator layer adapted for formation of a diode.

6. The method of claim 1, wherein the layer or layers of material selected for formation of a phase change memory element include a layer of chalcogenide.

7. The method of claim 6, including a heating/barrier element between the layer of chalcogenide and the sidewall spacer electrodes.

8. The method of claim 1, including forming an intermediate heating/barrier layer of material having a first resistance, over the sidewall spacer electrodes, the intermediate layer being in heat flow communication with the layer or layers of material selected for formation of a phase change memory, wherein the layer or layers of material selected for formation of a phase change memory has a first phase having a lower resistance and a second phase having a higher resistance, the first resistance being greater than the higher resistance of the phase change material in the second phase.

9. The method of claim 8, wherein the intermediate layer of material includes a barrier to at least one of diffusion and electromigration.

10. A method of forming a plurality of phase change memory cells, the method including:

forming at least two sidewall spacer electrodes, including depositing a conductive material conforming to sidewalls of a trench and removing a portion of the deposited conductive material along a bottom of the trench to define first and second sidewall spacer electrodes along opposing walls of the trench;

forming a memory phase change material layer over a plurality of the sidewall spacer electrodes;

forming a word line conductive layer over the phase change layer;

patterning the word line conductive layer and the memory phase change material layer to define a word line segment spanning the plurality of sidewall spacer electrodes.

11. The method of claim 1, wherein the memory phase change material layer spans a plurality of sidewall spacer electrodes.

12. The method of claim 1, wherein the memory phase change material layer is continuous across at least two of the plurality of sidewall spacer electrodes, after patterning.

13. The method of claim 1, wherein particular sidewall spacer electrodes are formed over a first metal layer, which is formed over an insulator layer, the metal layer and the insulator layer acting as a diode; and the insulator layer is formed over a bit line conductive layer.

14. The method of claim 1, wherein particular sidewall spacer electrodes are formed over a P+ doped silicon layer, which is formed over an N type silicon layer; and the N type silicon layer is formed over an N+ doped silicon bit line.

15. A memory device, comprising:

a substrate;

a first plurality of conductive lines on the substrate extending in a first direction;

a second plurality of conductive lines above the first plurality of conductive lines, and extending in a second direction and crossing over the first plurality of conductive lines at intersections;

a plurality of memory cells at said intersections and in electrical contact with the first and second pluralities of conductive lines, the memory cells comprising self-aligned structures including a selection device, a sidewall spacer electrode formed over the selection device as one of a pair of sidewall spacer electrodes on opposing sides of trenches and a phase change memory element.

16. A memory device, comprising:

a substrate;

a first plurality of conductive lines on the substrate extending in a first direction;

a second plurality of conductive lines above the first plurality of conductive lines, and extending in a second direction and crossing over the first plurality of conductive lines at intersections;

a plurality of memory cells at said intersections and in electrical contact with the first and second pluralities of conductive lines, the memory cells comprising self-aligned structures including a tunnel diode selection device, a bottom electrode and a phase change memory element that is continuous across more than one bottom electrode and more than one memory cell.

* * * * *